(12) United States Patent
Chen et al.

(10) Patent No.: US 8,836,855 B2
(45) Date of Patent: Sep. 16, 2014

(54) THIN IMAGE CAPTURING APPARATUS

(76) Inventors: Shu-Tze Chen, Taichung (TW);
Wen-Ching Chen, Taichung (TW)

(*) Notice: Subject to any disclaimer, the term of this patent is extended or adjusted under 35 U.S.C. 154(b) by 443 days.

(21) Appl. No.: 13/211,005

(22) Filed: Aug. 16, 2011

(65) Prior Publication Data

US 2012/0044414 A1    Feb. 23, 2012

(30) Foreign Application Priority Data

Aug. 23, 2010 (TW) .............................. 99128127 A

(51) Int. Cl.
*H04N 5/225* (2006.01)
(52) U.S. Cl.
CPC .................................. *H04N 5/2251* (2013.01)
USPC ........................................................ 348/374
(58) Field of Classification Search
CPC .................................. H01J 40/14; H01L 23/02
USPC ............................................. 438/64; 348/374
See application file for complete search history.

(56) References Cited

U.S. PATENT DOCUMENTS

| | | | | |
|---|---|---|---|---|
| 6,040,612 | A * | 3/2000 | Minami et al. | 257/432 |
| 6,586,824 | B1 * | 7/2003 | Glenn et al. | 257/680 |
| 6,703,598 | B2 * | 3/2004 | Muramatsu et al. | 250/214.1 |
| 7,084,474 | B2 * | 8/2006 | Hung et al. | 257/434 |
| 7,825,985 | B2 * | 11/2010 | Westerweck et al. | 348/374 |
| 8,587,096 | B2 * | 11/2013 | Kim et al. | 257/659 |
| 2001/0050721 | A1 * | 12/2001 | Miyake | 348/374 |
| 2002/0191103 | A1 * | 12/2002 | Akimoto et al. | 348/374 |
| 2003/0091777 | A1 * | 5/2003 | Jones et al. | 428/40.1 |
| 2005/0219398 | A1 * | 10/2005 | Sato et al. | 348/340 |
| 2009/0262226 | A1 * | 10/2009 | Lee et al. | 348/294 |

* cited by examiner

*Primary Examiner* — Gary C Vieaux
(74) *Attorney, Agent, or Firm* — Wang Law Firm, Inc.; Li K. Wang; Stephen Hsu

(57) ABSTRACT

A thin image capturing apparatus includes a circuit substrate having at least one electronic component, a light sensing element packaged onto the circuit substrate, and a camera lens installed onto the light sensing element for capturing images.

4 Claims, 15 Drawing Sheets

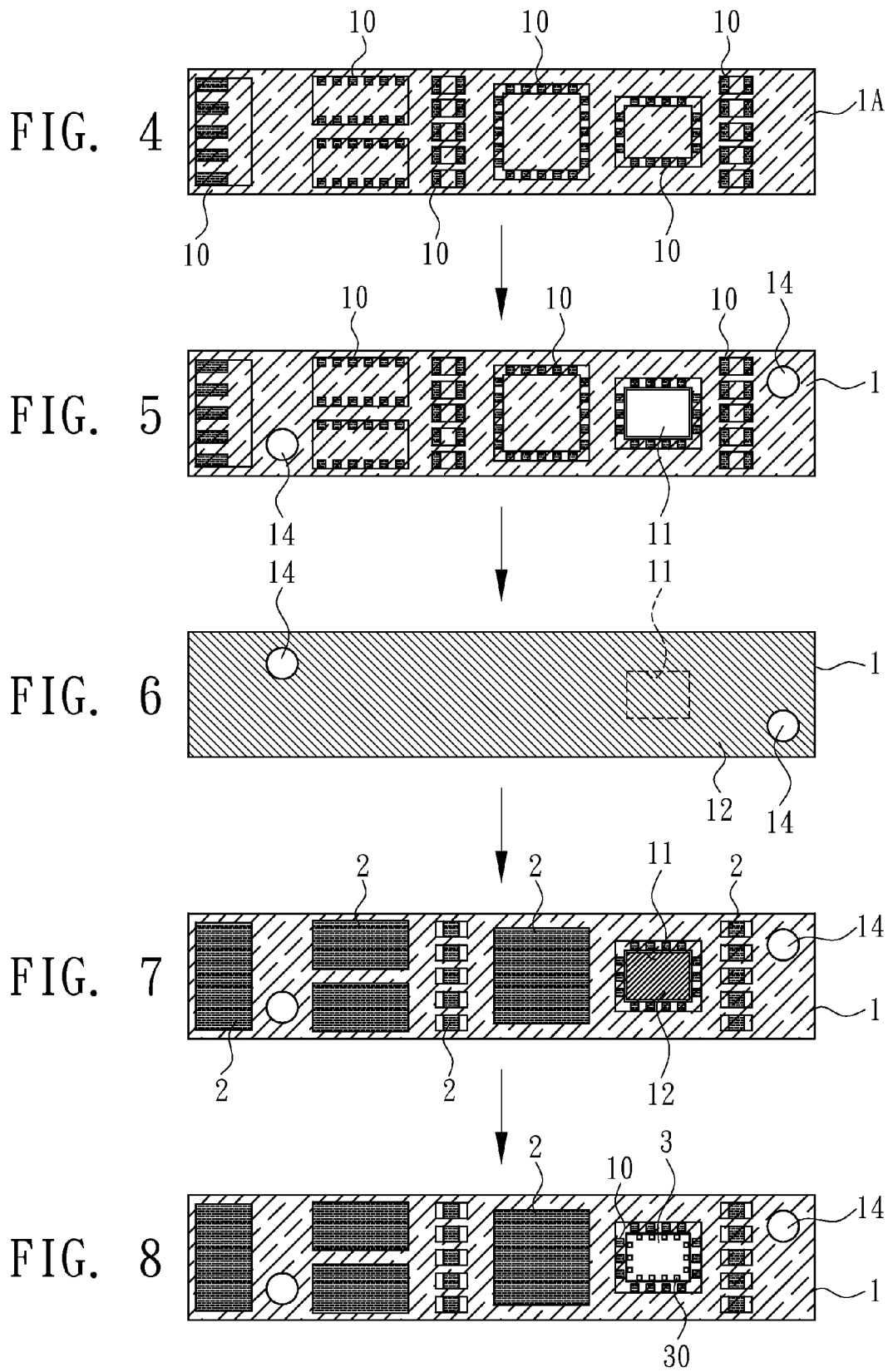

THIN IMAGE CAPTURING APPARATUS

BACKGROUND OF THE INVENTION

1. Field of the Invention

The present invention relates to an image capturing device, and more particularly to a thin image capturing apparatus.

2. Brief Description of the Related Art

In some of present notebook computers available in the market, an image capturing device is installed at the top of a screen to capture images for communications or video records. As notebook computers tend to be developed with a light, thin, short and compact design and the pixel requirement of the image capturing device becomes increasingly higher, the thickness of a casing of the notebook computer can be as thin as 5 mm only, and the space for installing a 3 mega-pixel image capturing device (including a camera lens) is only 3.5 mm. As to the concurrent way of assembling image capturing devices, the overall thickness of the 3 mega-pixel image capturing device becomes greater and results in a bottleneck for assembling an image capturing device with a larger pixel value into a 3.5 mm-space, so that major manufacturers improve the packaging technology to overcome this problem with full commitment and dedication.

With reference to FIG. 20 for a conventional packaging structure 90 of an image capturing device, the packaging structure 90 comprises a light sensing element 900, a translucent plate 901, and a circuit substrate 902, wherein the translucent plate 901 includes a circuit 903 coupled to a signal output, electrically coupled to a contact point 904 of the light sensing element 900, and sealed with an adhesive 905, and another side of the translucent plate 901 is electrically coupled to the circuit substrate 902 to form the packaging structure 90. Compared with the packaging structure of an earlier stage, this packaging structure 90 has reduced the overall thickness, but when the camera lens 906 is installed onto the circuit substrate 902, the position of the camera lens 906 must be aligned precisely with a sensing area of the light sensing element 900. For a small discrepancy, poor images may result, and thus the packaging structure 90 must be calibrated manually for precisely installing the camera lens 906 at a correct position of the circuit substrate 902, and the operation is very troublesome and impractical.

With reference to FIG. 21 for another packaging structure 91 of a conventional image capturing device, the packaging structure 91 also comprises a light sensing element 910, a translucent plate 911, and a circuit substrate 912, wherein the circuit substrate 912 has an opening 913, and the translucent plate 911 is installed onto the light sensing element 910, and the light sensing element 910 is installed onto a side of the translucent plate 911 and attached onto the substrate 912 by an adhesive 914. Meanwhile, a solder pad 915 of the light sensing element 910 is electrically coupled to the circuit substrate 912. Now, the translucent plate 911 is situated inside the opening 913 of the circuit substrate 912 for reducing the overall thickness to constitute this packaging structure 91. Compared with the foregoing packaging structure 90, this packaging structure 91 has a smaller package size, but this packaging structure 91 still has the same problem as the foregoing packaging structure 90 that requires a manual calibration to precisely install the camera lens 916 onto circuit substrate 912, and thus both packaging structure 90 and packaging structure 91 have not been used in actual productions yet.

With reference to FIG. 22 for another packaging structure 92 of a conventional image capturing device, the packaging structure 92 also comprises a light sensing element 920, a translucent plate 921, a circuit substrate 922, and a heat dissipating substrate 923, wherein both light sensing element 920 and circuit substrate 922 are installed onto the heat dissipating substrate 923, and the circuit substrate 922 has an opening 924 for exposing the light sensing element 920, and the light sensing element 920 is electrically coupled to the circuit substrate 922 by a connecting wire 925, and the translucent plate 921 is installed onto two pads 926 and disposed at the top of the light sensing element 920, and a camera lens 927 is installed at the translucent plate 921 to constitute the packaging structure 92. However, this packaging structure 92 requires an additional installation of the heat dissipating substrate 923, so that the overall thickness of the packaging structure 92 is relatively large, and requires further improvements.

With reference to FIG. 23 for another packaging structure 93 of a conventional image capturing device, the packaging structure 93 comprises a light sensing element 930, a metal plate 931, and a circuit substrate 932, wherein the metal plate 931 is installed at the bottom of the circuit substrate 932, and the circuit substrate 932 has an opening 933, and the metal plate 931 is exposed from the bottom of the opening 93, and the light sensing element 930 is contained in the opening 933 and whose bottom is attached to the metal plate 931 bottom, and the light sensing element 930 and the circuit substrate 932 are electrically coupled by a gold wire 934. However, the metal plate 931 and the circuit substrate 932 are made of different materials, so that it is difficult to attach the metal plate 931 with the circuit substrate 932 due to the significantly different coefficients of thermal expansion. It is very often to see a separation of the metal plate 931 and the circuit substrate 932 caused by thermal expansion or a poor attachment. As a result, the light sensing element 930 and the circuit substrate 932 are displaced with respect to each other easily when they are shock or vibrated, and the fine gold wire 934 will be pulled or broken easily.

SUMMARY OF THE INVENTION

To overcome the aforementioned problems, it is a primary objective of the present invention to provide a thin image capturing apparatus with an overall thickness smaller than the conventional image capturing device and in compliance with the required thickness of a thin casing of a notebook computer.

To achieve the aforementioned objective, the present invention provides a thin image capturing device, comprising:

a circuit substrate, having at least one electronic component installed thereon, and electrically coupled by a circuit, and the circuit substrate having a hole; a light sensing element, embedded into the hole of the circuit substrate, and having a sensing surface.

BRIEF DESCRIPTION OF THE INVENTION

FIG. 4 is a schematic view of a pre-manufactured structure of a circuit substrate in accordance with the first preferred embodiment of the present invention;

FIG. 5 is a schematic view of a structure of a circuit substrate with a hole and a locking hole in accordance with the first preferred embodiment of the present invention;

FIG. 6 is a schematic view of the backside of a circuit substrate with an attached metal thin film in accordance with the first preferred embodiment of the present invention;

FIG. 7 is a schematic view of the front side of a circuit substrate with an attached metal thin film in accordance with the first preferred embodiment of the present invention;

FIG. 8 is a schematic view of a circuit substrate packaged with a light sensing element in accordance with the first preferred embodiment of the present invention;

DETAILED DESCRIPTION OF THE PREFERRED EMBODIMENTS

With reference to FIGS. 1 to 13 for the first preferred embodiments of the present invention, this embodiment is provided for the purpose of illustrating the structure and manufacturing method of the invention, but not intended for limiting the scope of the invention.

Figure 1:
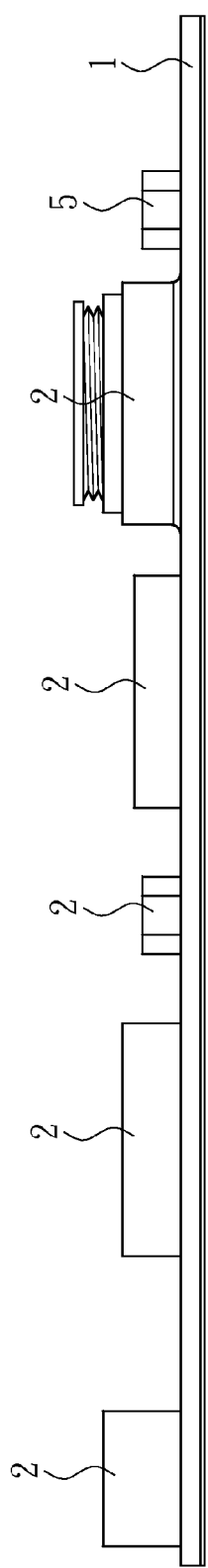
FIG. 1 is a side view of a first preferred embodiment of the present invention.
Figure 2:
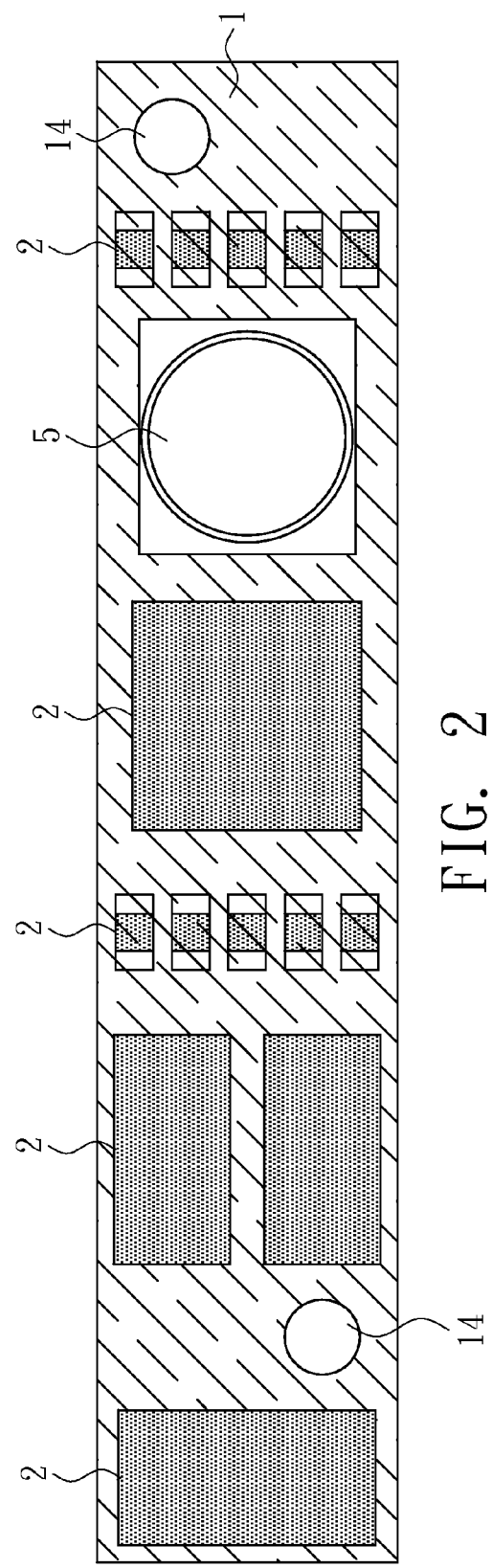
FIG. 2 is a top view of the first preferred embodiment of the present invention.
Figure 3:
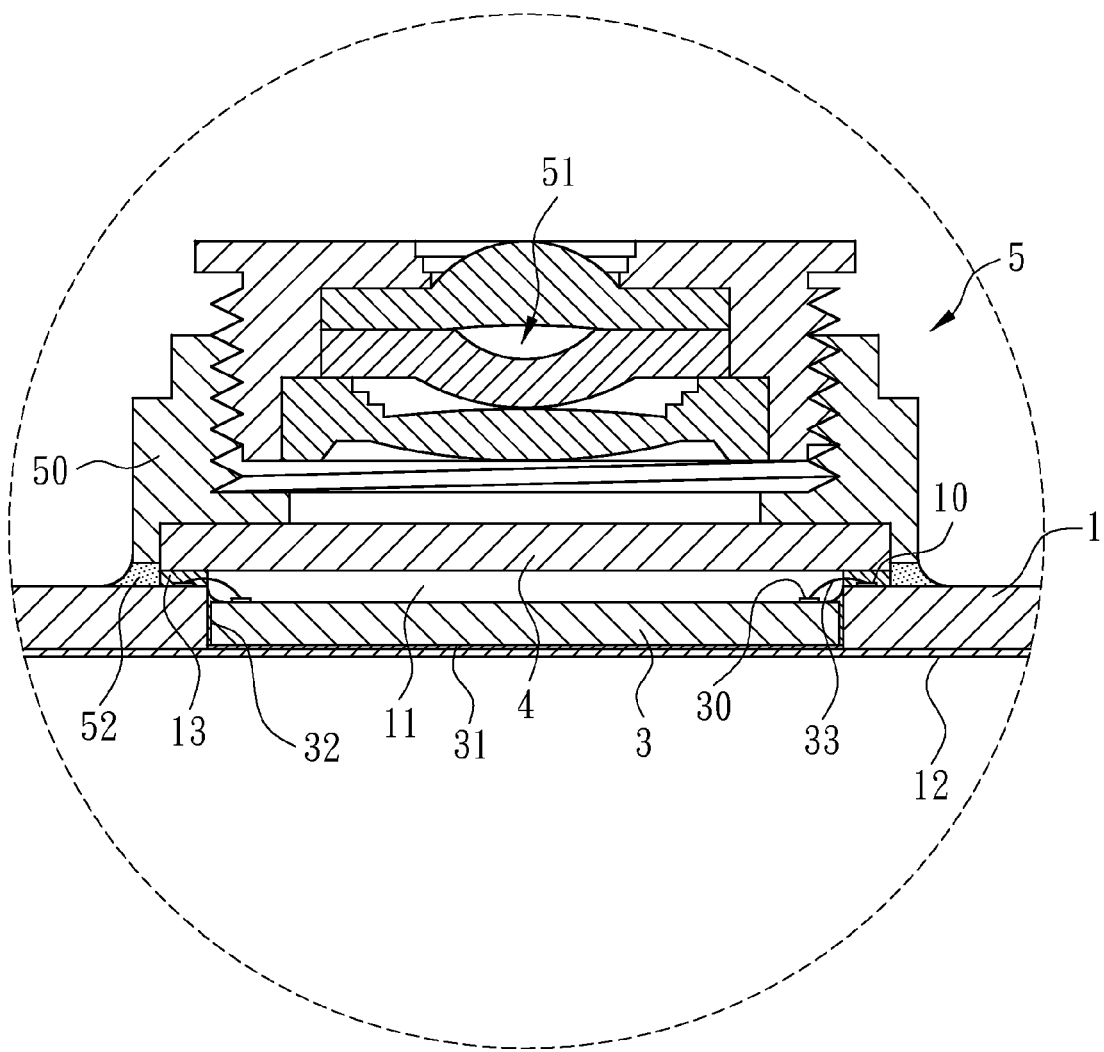
FIG. 3 is a cross-sectional view of a light sensing element package in accordance with the first preferred embodiment of the present invention.

The present invention provides a thin image capturing apparatus as shown in FIGS. 1 to 3, and the image capturing device of this preferred embodiment comprises a circuit substrate 1, a plurality of electronic components 2, a light sensing element 3, a translucent plate 4, and a camera lens 5.

In FIG. 3, the circuit substrate 1 has a solder pad 10 disposed on a front side of the circuit substrate 1, and the solder pad 10 is coupled to a circuit (not shown in the figure) in the circuit substrate 1, and the electronic components 2 are coupled to the solder pad 10 of the circuit substrate 1 and electrically coupled by a circuit of the circuit substrate 1. The circuit substrate 1 has a hole 11 with a shape and a size capable of containing the light sensing element 3, and the size of the hole 11 is substantially equal to the size of the light sensing element 3, and the circuit substrate 1 includes a metal thin film 12 attached thereon, and the metal thin film 12 of this preferred embodiment is attached onto the backside of the circuit substrate 1 and has an area substantially equal to that of the circuit substrate, and the backside of the circuit substrate 1 is covered onto the hole 11.

In FIG. 3, the light sensing element 3 is embedded into the hole 11 of the circuit substrate 1, and the light sensing element 3 includes a sensing surface 34 (which is the light sensing area of receiving an image when the image is projected by the camera lens 5), and a plurality of solder pads 30 corresponding to the circuit substrate 1. In this preferred embodiment, the solder pads 30 and the sensing surface 34 are disposed on the same side of the light sensing element 3. The bottom of the light sensing element 3 is attached onto by the metal thin film 12 by an adhesive layer 31, wherein the adhesive layer 31 of this preferred embodiment is made of an adhesive material which is an electrically conductive adhesive, for grounding the light sensing element 3 through the metal thin film 12. A first fixing adhesive 32 is filled into the gap between the circuit substrate 1 and the light sensing element 3 for fixing the circuit substrate 1 and the light sensing element 3. In other words, the first fixing adhesive 32 is filled between the hole 11 of the circuit substrate 1 and the light sensing element 3. After the first fixing adhesive 32 is cured, the circuit substrate 1 and the light sensing element 3 are integrally formed. The solder pad 10 of the circuit substrate 1 and the solder pad 30 of the light sensing element 3 are electrically coupled by an electrically conductive wire 33, and a second fixing adhesive 13 is applied onto the solder pad 10 of the circuit substrate 1 and covered onto the attached position of the electrically conductive wire 33. The first fixing adhesive 32 and the second fixing adhesive 13 are non-conductive adhesives.

In FIG. 3, the translucent plate 4 of this preferred embodiment is a piece of transparent glass, and the translucent plate 4 is aligned precisely with the sensing surface 34 of the light sensing element 3 and fixed onto the second fixing adhesive 13 and covered onto the light sensing element 3 for sealing the sensing surface 34 of the light sensing element 3 inside the hole 11, such that the light sensing element 3 can perform a light sensing without being affected by dirt and stray light.

In FIG. 3, the camera lens 5 includes a lens module 51 installed inside a camera lens holder 50 for capturing an image. The bottom of the camera lens holder 50 is aligned evenly with the translucent plate 4, wherein a third fixing adhesive 52 is applied in this preferred embodiment for attaching and fixing the circuit substrate 1, and the third fixing adhesive 52 of this preferred embodiment is a non-conductive adhesive. The lens module 51 installed inside the camera lens holder 50 projects images within the sensing area of the light sensing element 4. Of course, the bottom of the camera lens holder 50 can be attached to the translucent plate 4 by a third fixing adhesive 52 to achieve the effect of fixing the camera lens holder 50.

Figure 9:
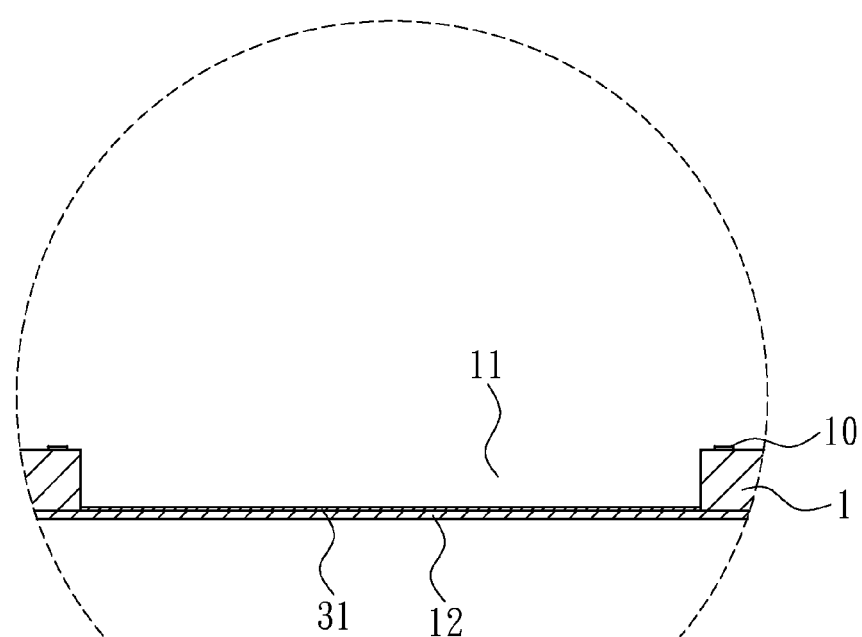
FIG. 9 is a schematic view of a circuit substrate with an adhesive layer coated into a hole in accordance with the first preferred embodiment of the present invention.
Figure 10:
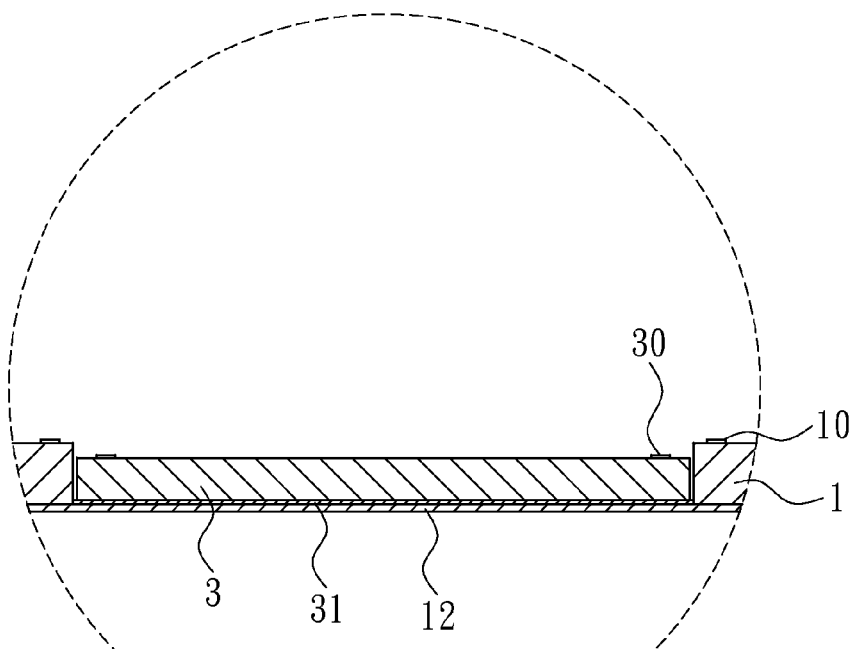
FIG. 10 is a schematic view of a circuit substrate having a light sensing element attached onto an adhesive layer of the circuit substrate in accordance with the first preferred embodiment of the present invention.
Figure 11:
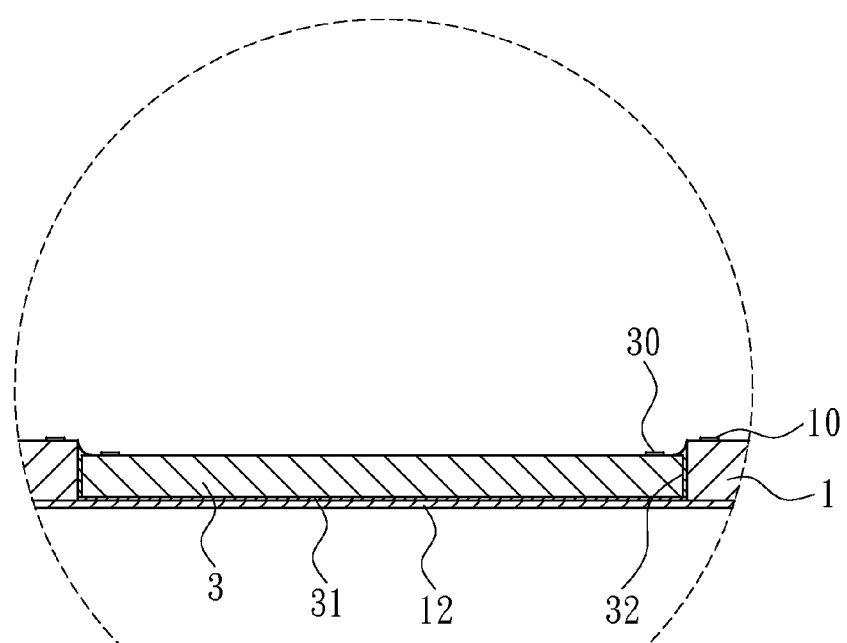
FIG. 11 is a schematic view of fixing a light sensing element onto a circuit substrate in accordance with the first preferred embodiment of the present invention.
Figure 12:
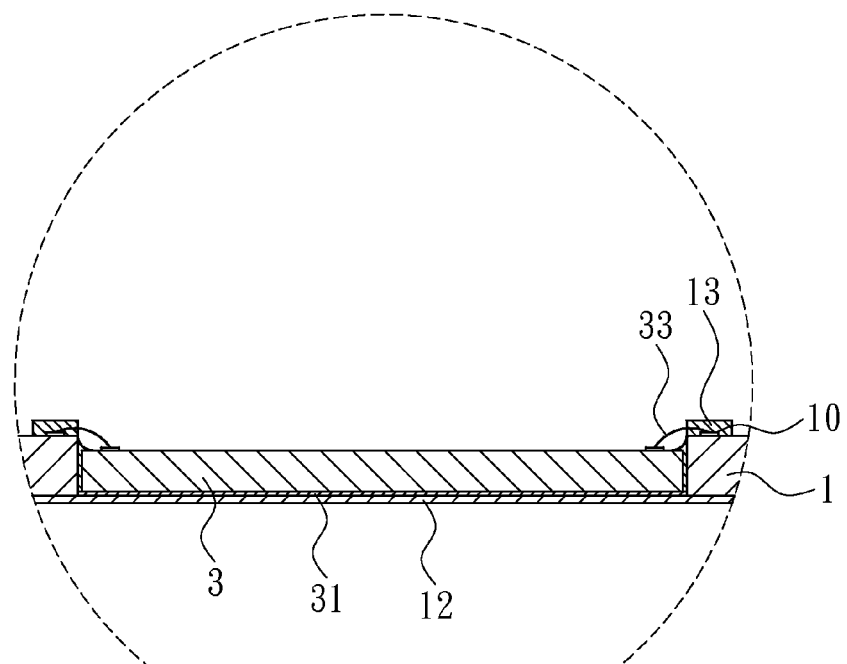
FIG. 12 is a schematic view of a circuit substrate electrically coupled to a light sensing element and fixed by an adhesive in accordance with the first preferred embodiment of the present invention.
Figure 13:
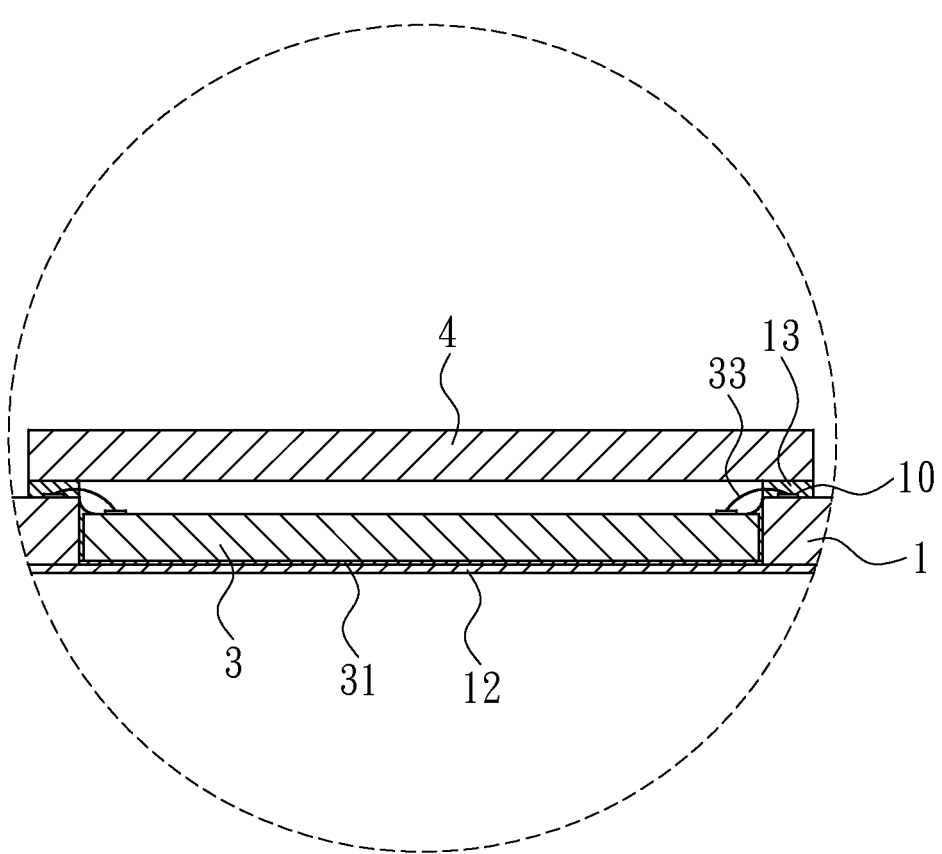
FIG. 13 is a schematic view of a translucent plate fixed onto a circuit substrate in accordance with the first preferred embodiment of the present invention.

From the description above, the structure of this preferred embodiment of the present invention is illustrated. The manufacturing method of the image capturing device of this preferred embodiment is described as follows. The manufacturing method comprises the steps of: preparing a circuit substrate 1 as shown in FIG. 4; forming a hole on the circuit substrate 1 as shown in FIG. 5; attaching a metal thin film 12 as shown in FIGS. 6 and 7; packaging a light sensing element 3 as shown in FIG. 8; coating an adhesive layer 31 as shown in FIG. 9; adhering the light sensing element 3 as shown in FIG. 10; fixing the light sensing element 3 as shown in FIG. 11; bonding an electrically conductive wire 33 as shown in FIG. 12 and sealing the hole 11 as shown in FIG. 12, covering a transparent glass 4 as shown in FIG. 13; installing a camera lens 5 (wherein the installed camera lens 5 is shown in FIG. 3); and finally surface mounting electronic components (as shown in FIGS. 7 and 8).

The aforementioned image capturing device and the manufacturing method thereof in accordance with the present invention have the following advantages:

1. In the manufacturing method of the image capturing device in accordance with the present invention, the light sensing element 3 is embedded into the circuit substrate 1, and the translucent plate 4 with a smaller thickness is fixed onto the circuit substrate 1 and covered onto the light sensing element 3, so that the image capturing device of the present invention has a smaller overall thickness than those of the conventional image capturing devices to meet the thin casing requirement of the present notebook computers and overcome the difficulty of installing the present casing into a 3.5 mm-thickn casing as well as allowing the image capturing device with a higher pixel value to be installed into the thin casing of the present notebook computers.

2. In the screen of the present notebook computers, the frame of the screen is minimized, so that the maximum width of the camera device is limited to 6 mm or 8 mm, and the circuit substrate is also limited by these widths. Although the image capturing device of the present invention has a larger chip, the width deducting the width of the hole 11 can still reserve an appropriate width from both sides in order to installing the circuit and bonding the wires. The present invention can comply with the limitations of width and size.

3. When the camera lens 5 of the present invention is assembled, the translucent plate 4 installed on the light sensing element 3 has been aligned precisely with the sensing area, so that it simply requires to fix the bottom of the camera lens holder 50 to the translucent plate 4 directly. Now, the lens module 51 in the camera lens 5 can be aligned precisely with the sensing area of the light sensing element 3, so as to overcome the difficulty of assembling and aligning the conventional camera lens.

4. The metal thin film 12 attached onto the backside of the circuit substrate 1 has a shielding effect, so that electromagnetic interference produced by the image capturing device or other external devices can be shielded.

5. The light sensing element 3 in the hole 11 of the circuit substrate 1 is adhered and fixed by filling the first fixing adhesive 32 around the gap, such that the light sensing element 3 and the circuit substrate 1 are coupled integrally as a whole. Even if the circuit substrate 1 is shock or vibrated, the light sensing element 3 and the circuit substrate 1 are shock or vibrated simultaneously, so as to maintain the electrically conductive wire 33 to be electrically coupled onto the solder pad and prevent the electrically conductive wire 33 from being pulled or broken by the shaking or vibration.

Figure 14:
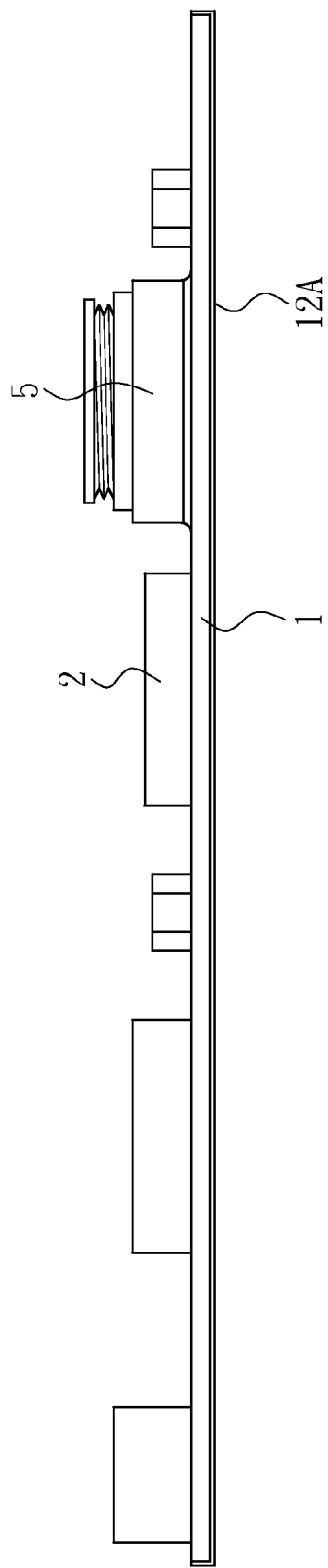
FIG. 14 is a schematic view of a metal thin film extended to a lateral side of a circuit substrate in accordance with a second preferred embodiment of the present invention.
Figure 15:
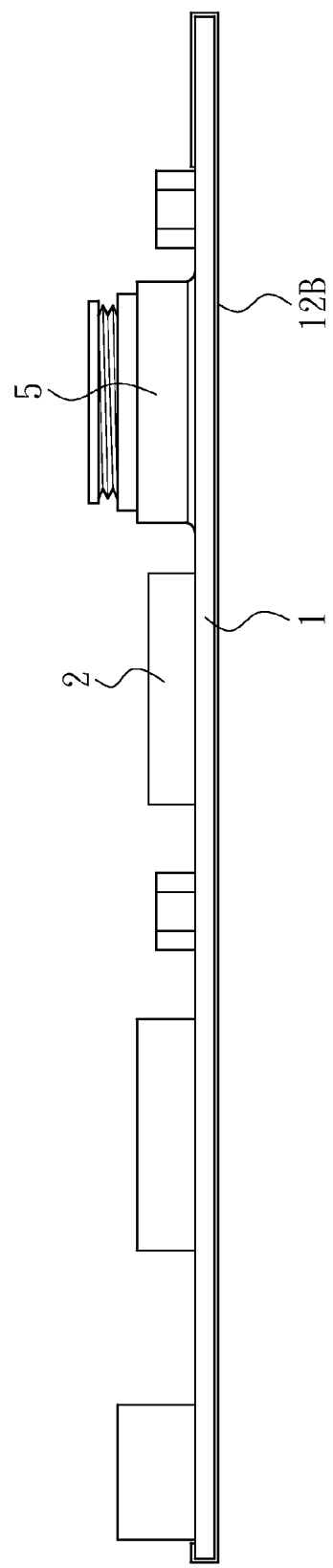
FIG. 15 is a schematic view of a metal thin film extended from a lateral side to a top side of a circuit substrate in accordance with a third preferred embodiment of the present invention.
Figure 16:
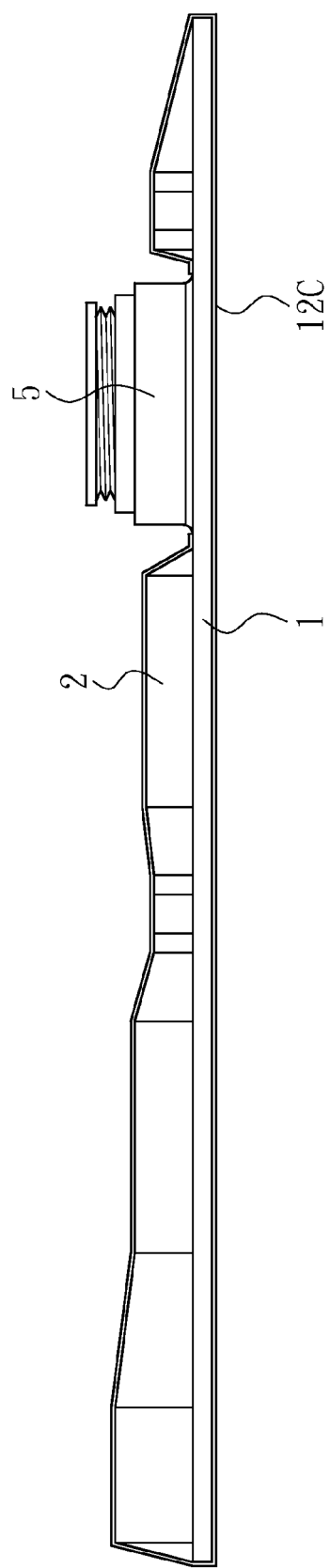
FIG. 16 is a schematic view of a metal thin film extended from a lateral side of a circuit substrate and covered from the front in accordance with a fourth preferred embodiment of the present invention.

Of course, the present invention can be implemented according to other embodiments, but the variation is very small. With reference to FIG. 14 for another preferred embodiment of the present invention, the metal thin film 12A having a size equal to or slightly smaller than the backside of the circuit substrate 1 is attached, and then extended from the backside to the lateral side of the circuit substrate 1. With reference to FIG. 15 for a third preferred embodiment of the present invention, the metal thin film 12B is extended from the lateral side to the top side of the circuit substrate 1. With reference to FIG. 16 for a fourth preferred embodiment of the present invention, the metal thin film 12C is covered from the lateral side of the circuit substrate 1 to the electronic component 2 installed on the front side of the circuit substrate 1 and having the camera lens 5 exposed. The metal thin films 12A, 12B, 12C in accordance to the second, third and fourth preferred embodiments of the present invention respectively achieve the same effect of shielding electromagnetic interference.

Figure 17:
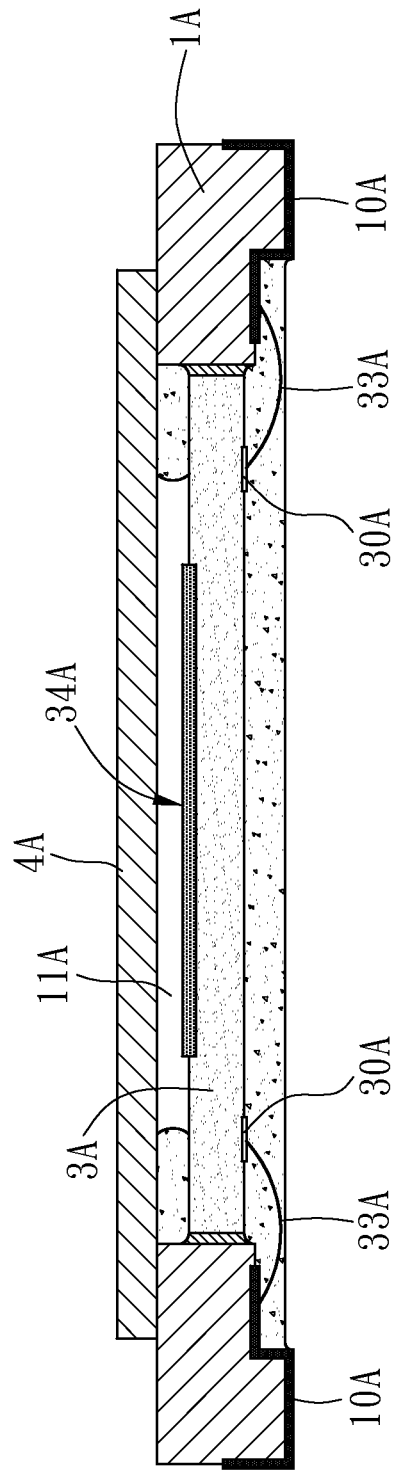
FIG. 17 is a cross-sectional view of a light sensing element package in accordance with a fifth preferred embodiment of the present invention.

With reference to FIG. 17 for a fifth preferred embodiment of the present invention, the image capturing device of this preferred embodiment comprises a circuit substrate 1A, a plurality of electronic components (not shown in the figure), a light sensing element 3A, and a camera lens (not shown in the figure) installed on the light sensing element 3A. The translucent plate 4A has a surface area capable of sealing an end of the hole 11A, and at least the periphery of the sensing surface 34A of the light sensing element 3A is attached onto the translucent plate 4A by an adhesive layer. The circuit substrate 1A, the light sensing element 3A and the translucent plate 4A are attached by using the adhesive layer, wherein the adhesive layer of this preferred embodiment can be an electrically conductive adhesive or a high polymer.

Wherein, the solder pad 10A is situated at the backside of the circuit substrate 1A, and the solder pads 30A of the light sensing element 3A are installed on the opposite side of the sensing surface 34A. In other words, the solder pad 30A is installed on the backside of the light sensing element 3A and disposed on the same side of the corresponding solder pad 10A of the printed circuit board 1A, and a second fixing adhesive 13A is covered at a position wherein the gold wire 33A is electrically coupled to the solder pad 10A of the circuit substrate 1A and the plurality of solder pads 30A of the light sensing element 3A.

The major difference between the image capturing device of this preferred embodiment and the image capturing device of the first preferred embodiment of the present invention is that the light sensing element 3A is a backside illumination sensor (BSI), and the solder pads 30A are arranged on the opposite side of the sensing surface 34A, and the solder pad 10A of the circuit substrate 1A is arranged on the same side of the plurality of solder pads 30. In other words, the solder pads 10A are disposed on the backside of the circuit substrate 1A, so that after the light sensing element 3A is fixed onto the circuit substrate 1A, the electrically conductive wire 33A can be used for electrically coupling the plurality of solder pads 10A and the solder pad 30A to achieve the effect of capturing images.

Figure 18:
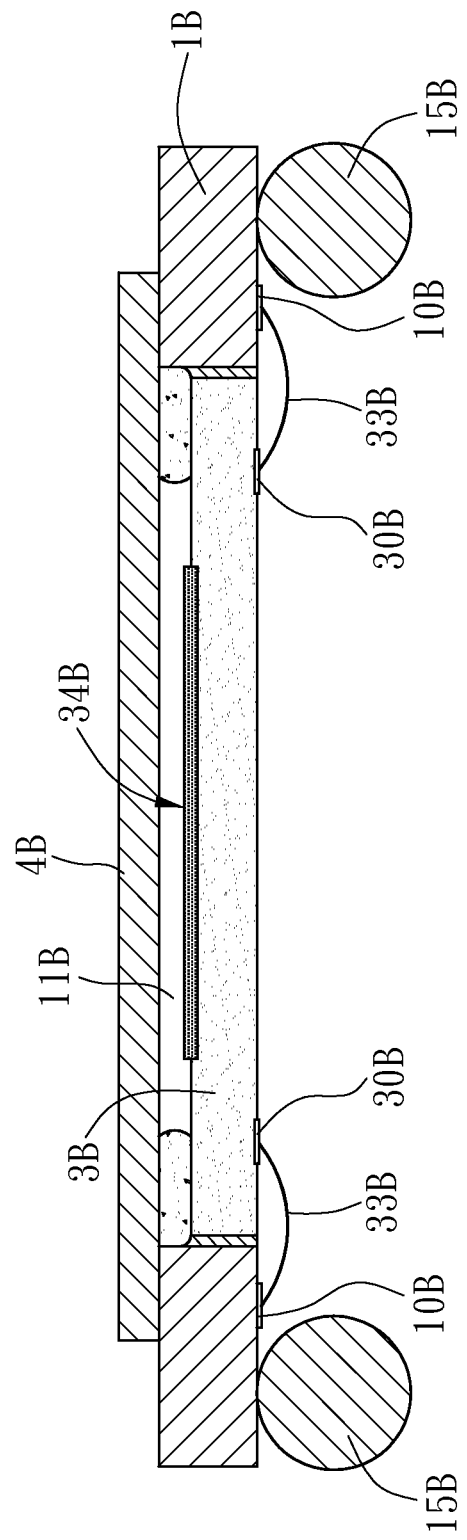
FIG. 18 is a cross-sectional view of a light sensing element package in accordance with a sixth preferred embodiment of the present invention.

With reference to FIG. 18 for a sixth preferred embodiment of the present invention, the image capturing device of this preferred embodiment comprises a circuit substrate 1B, a plurality of electronic components (not shown in the figure), a light sensing element 3B, and a camera lens (not shown in the figure) installed on the light sensing element 3B. Wherein, the light sensing element 3B of this preferred embodiment is also a backside illumination sensor, and the solder pad 10B of the circuit substrate 1B is also installed on the backside, and the solder pads 30B of the light sensing element 3B is also installed on the opposite side of the sensing surface 34B, and the solder pad 10B of the circuit substrate 1B and the plurality of solder pads 30B of the light sensing element 3B are also electrically coupled by an electrically conductive wire 33B, and the circuit substrate 1B includes a solder ball 15B disposed adjacent to the solder pad 10B.

In addition, the circuit substrate 1B includes a translucent plate 4B attached thereon, and the surface area of the translucent plate 4B is equal to a size capable of sealing an end of the hole 11B, and at least the periphery of the sensing surface 34B of the light sensing element 3B is attached onto the translucent plate 4B by an adhesive layer. The adhesive layers used for the circuit substrate 1B, the light sensing element 3B and the translucent plate 4B in this preferred embodiment can be an electrically conductive adhesive or a high polymer. Therefore, the structure of this preferred embodiment can achieve the effect of capturing images.

Figure 19:
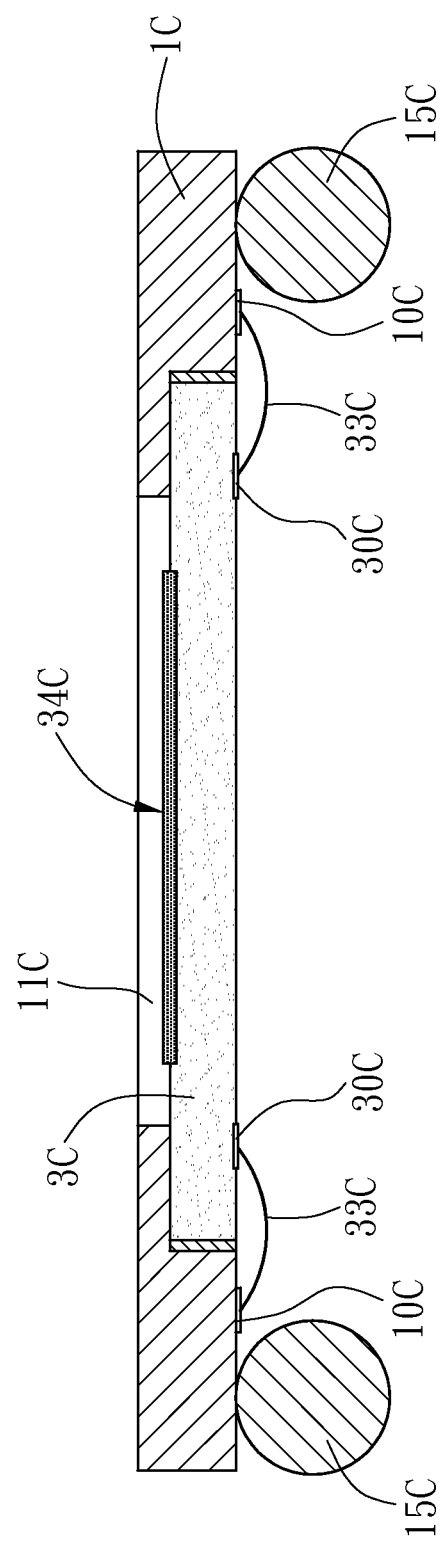
FIG. 19 is a cross-sectional view of a light sensing element package in accordance with a seventh preferred embodiment of the present invention.
Figure 20:
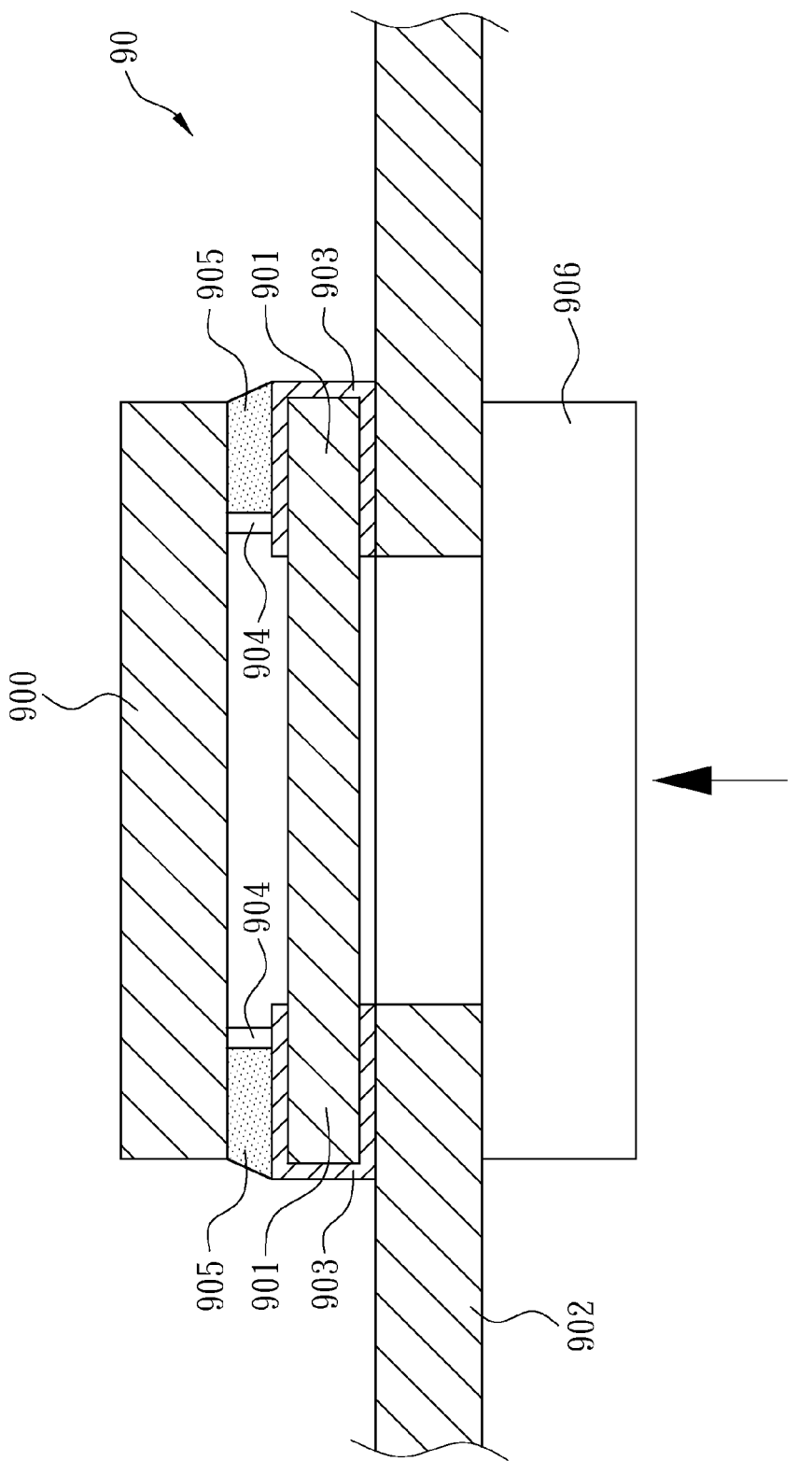
FIG. 20 is a cross-sectional view of a first conventional packaging structure.
Figure 21:
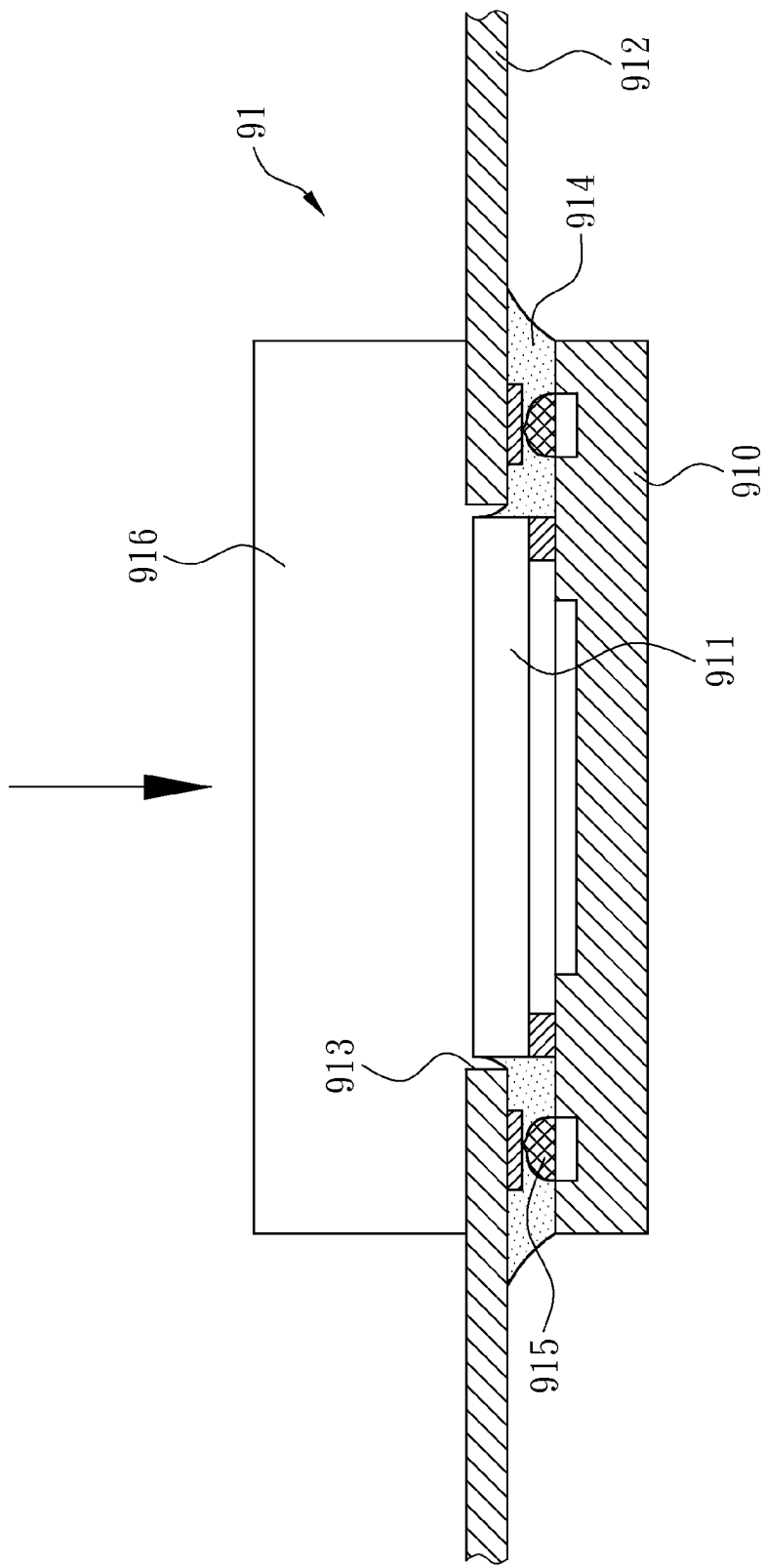
FIG. 21 is a cross-sectional view of a second conventional packaging structure.
Figure 22:
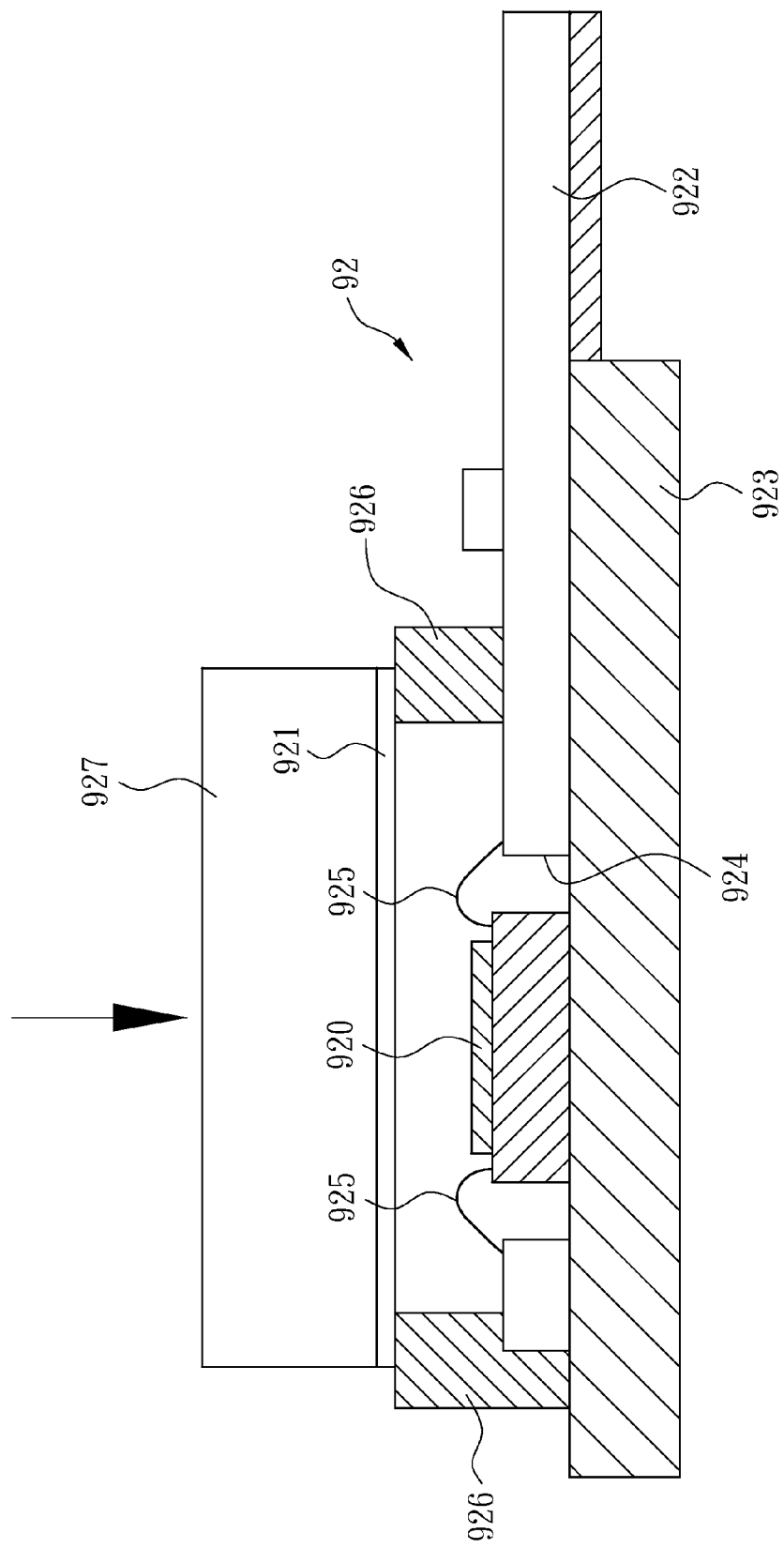
FIG. 22 is a cross-sectional view of a third conventional packaging structure.
Figure 23:
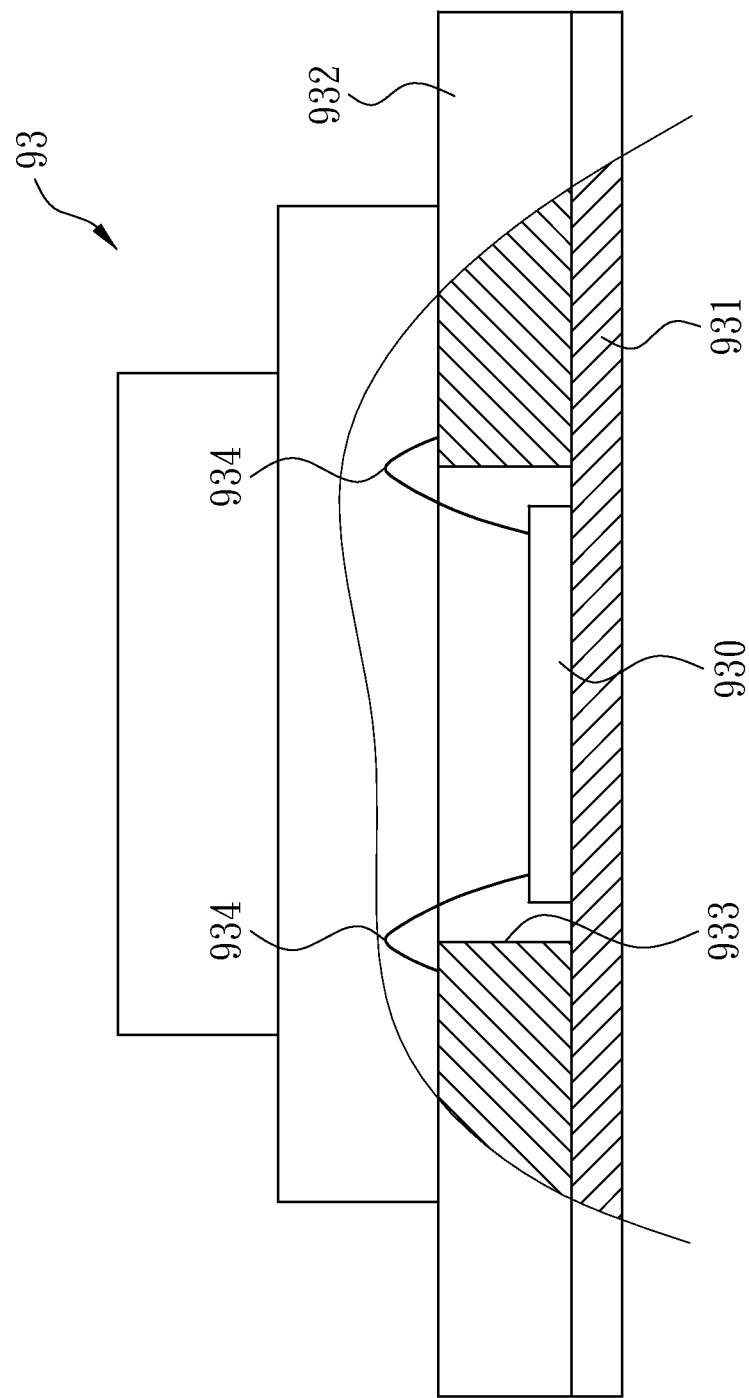
FIG. 23 is a cross-sectional view of a fourth conventional packaging structure.

With reference to FIG. 19 for a seventh preferred embodiment of the present invention, the image capturing device of this preferred embodiment comprises a circuit substrate 1C, a plurality of electronic components (not shown in the figure), a light sensing element 3C, and a camera lens (not shown in the figure) installed on the light sensing element 3C. Wherein, the light sensing element 3C of this preferred embodiment is also a backside illumination sensor, and the solder pad 10C of the circuit substrate 1C is also installed on the backside, and the solder pads 30C of the light sensing element 3C are installed on the opposite side of the sensing surface 34C, and the solder pad 10C of circuit substrate 1C and the solder pads 30C of the light sensing element 3C are electrically coupled by a gold wire 33C, and the circuit substrate 1C includes a solder ball 15C disposed adjacent to the solder pad 10C.

In the circuit substrate 1C of this preferred embodiment, the interior of the hole 11C is step-shaped, and the hole areas of upper and lower ends of the hole 11C are different. In FIG. 19, the area of the lower end of the hole 11C is greater than the area of the upper end of the hole 11C, wherein the section of the hole 11C with greater area can contain the light sensing element 3C, and the section of the hole with a smaller area has a size smaller than the light sensing element 3C and greater than the sensing area of the light sensing element 3C. The sensing surface 34C of the light sensing element 3C is attached onto a plane of the internal step-shape and at a position where the adhesive layer is attached to the hole 11C of the circuit substrate 1C, such that the structure of this preferred embodiment also can achieve the effect of capturing images.

What is claimed is:

1. A thin image capturing apparatus, comprising:
a circuit substrate, having at least one electronic component installed thereon and electrically coupled by a circuit, and a hole formed in the circuit substrate; and a light sensing element, embedded into the hole of the circuit substrate, and having a sensing surface,
wherein the light sensing element is a backside illumination sensor, and a plurality of solder pads are installed on an opposite side of the sensing surface, and the circuit substrate includes a plurality of corresponding solder pads, and each corresponding solder pad is coupled between the circuit substrate and the light sensing element by an electrically conductive wire for an electric connection,
the hole of the circuit substrate is step shaped with different areas of upper and lower ends of the hole, the hole at a greater area is capable of containing the light sensing element, and the hole at a smaller area is smaller than the size of the light sensing element and greater than the sensing area of the light sensing element, and the sensing surface of the light sensing element is attached onto a plane formed by the step shape inside the circuit substrate hole by an adhesive layer.

2. The thin image capturing apparatus of claim 1, wherein the adhesive layer is made of an adhesive material which is an electrically conductive adhesive.

3. The thin image capturing apparatus of claim 1, wherein the circuit substrate includes a translucent plate attached thereon, and the area of the translucent plate is capable of sealing an end of the hole, and the sensing surface of the light sensing element is at least attached onto the periphery of the translucent plate by an adhesive layer.

4. The thin image capturing apparatus of claim 3, wherein the adhesive layer is made of an adhesive material which is an electrically conductive adhesive.

\* \* \* \* \*